United States Patent
Fox et al.

(10) Patent No.: US 7,974,141 B2
(45) Date of Patent: Jul. 5, 2011

(54) SETTING MEMORY DEVICE VREF IN A MEMORY CONTROLLER AND MEMORY DEVICE INTERFACE IN A COMMUNICATION BUS

(75) Inventors: Benjamin A Fox, Rochester, MN (US); William P Hovis, Rochester, MN (US); Thomas W Liang, Rochester, MN (US); Paul Rudrud, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 333 days.

(21) Appl. No.: 12/361,592

(22) Filed: Jan. 29, 2009

(65) Prior Publication Data

US 2010/0188908 A1    Jul. 29, 2010

(51) Int. Cl.
*G11C 5/14* (2006.01)
*G11C 7/00* (2006.01)
*G11C 8/16* (2006.01)
*H03K 17/16* (2006.01)
*H03K 19/094* (2006.01)

(52) U.S. Cl. ......... 365/189.09; 365/189.11; 365/233.13; 326/30; 326/83; 326/86

(58) Field of Classification Search .............. 365/189.09
See application file for complete search history.

(56) References Cited

U.S. PATENT DOCUMENTS

| | | | | |
|---|---|---|---|---|
| 6,049,221 | A * | 4/2000 | Ishibashi et al. ................. | 326/30 |
| 6,330,194 | B1 | 12/2001 | Thomann et al. | |
| 6,414,525 | B2 * | 7/2002 | Urakawa ....................... | 327/112 |
| 6,639,423 | B2 * | 10/2003 | Martin et al. .................... | 326/30 |
| 6,762,614 | B2 | 7/2004 | Rearick et al. | |
| 6,807,650 | B2 * | 10/2004 | Lamb et al. .................... | 716/101 |
| 6,958,942 | B2 * | 10/2005 | Chang ....................... | 365/189.07 |
| 7,362,622 | B2 * | 4/2008 | Braun et al. ............. | 365/189.09 |
| 7,411,407 | B2 * | 8/2008 | Rearick et al. ................ | 324/713 |
| 7,439,761 | B2 * | 10/2008 | Mayer et al. .................... | 326/30 |
| 7,489,160 | B2 * | 2/2009 | Kimura ........................... | 326/30 |
| 7,514,954 | B2 | 4/2009 | Kim et al. | |
| 7,515,487 | B2 | 4/2009 | Seo et al. | |
| 7,593,272 | B2 | 9/2009 | Doyle et al. | |
| 7,848,175 | B2 * | 12/2010 | Fox et al. .................. | 365/230.06 |
| 2008/0272800 | A1 * | 11/2008 | Haig et al. ...................... | 326/30 |
| 2010/0188908 | A1 | 7/2010 | Fox et al. | |
| 2010/0188917 | A1 | 7/2010 | Fox et al. | |
| 2010/0188919 | A1 | 7/2010 | Fox et al. | |
| 2010/0192000 | A1 | 7/2010 | Fox et al. | |

OTHER PUBLICATIONS

Notice of Allowance issued for U.S. Appl. No. 12/361,976, mail date Jul. 30, 2010, 7 pp.
JEDEC Standard; POD18—1.8 V Pseudo Open Drain I/O; JESD8-19 Datasheet [online]. JEDEC Solid State Technology Association, 2006 [retrieved on Mar. 12, 2008]. Retrieved from the Internet: <URL: http://www.jedec.org/download/search/JESD8-19.pdfl>.
Non-Final Office Action for U.S. Appl. No. 12/361,577, mailed Oct. 13, 2010, 10 pp.

\* cited by examiner

*Primary Examiner* — Son L Mai
(74) *Attorney, Agent, or Firm* — Toler Law Group

(57) ABSTRACT

A memory device is connected through an interface to a memory controller. The memory device's reference voltage is set based on a driver's impedance of the memory device and the controller driver drive strength during driver training. The voltage is applied to a reference resistor pair at the memory device and changed until the voltage level switches. The voltage is then set at the reference resistor pair of the memory device.

20 Claims, 5 Drawing Sheets

SETTING MEMORY DEVICE VREF IN A MEMORY CONTROLLER AND MEMORY DEVICE INTERFACE IN A COMMUNICATION BUS

RELATED APPLICATIONS

The present application relates to co-pending U.S. patent applications, entitled "Setting Controller VREF in a Memory Controller and Memory Device Interface in a Communication Bus" Ser. No. 12/361,719 "Setting Controller Termination in a Memory Controller and Memory Device Interface in a Communication Bus" Ser. No. 12/361,836 "Calibration of Memory Driver with Offset in a Memory Controller and Memory Device Interface in a Communication Bus" Ser. No. 12/361,976 "Setting Memory Controller Driver to Memory Device Termination Value in a Communication Bus" Ser. No. 12/361,577 and "Setting Memory Device Termination in a Memory Device and Memory Controller Interface in a Communications Bus" Ser. No. 12/361,602, by the present inventors, Paul W. Rudrud, Thomas W. Liang, Benjamin A. Fox, and William P. Hovis. The co-pending applications are filed concurrently herewith, and are incorporated by reference in their entireties.

FIELD OF THE INVENTION

This invention relates to devices and methods in which a memory device such as a GDDR3 DRAM and a memory controller are coupled during memory driver training to reduce mismatches by adjusting the reference voltage of the memory device. The invention further relates to conducting such adjustment to yield improvements in timing margins to remove known offset issues.

BACKGROUND OF THE INVENTION

In an electrical communication bus in which a memory controller is coupled with a memory device such as a GDDR3 DRAM memory, the DRAMs are designed to train their drive impedance and termination values against a reference resistor. However, process variations and resolutions may cause variations in the final DRAM training values. The variations may occur within a memory controller coupled to the DRAM if it trains in a similar manner, thereby causing a mismatch in DRAM and controller impedances.

The mismatch may cause timing offsets due to reference voltages not being properly aligned to the resulting data eye. The problem is described as occurring specifically in a GDDR3 interface from a memory controller to a GDDR3 memory device. However, the problem also occurs in a number of other system and sub-system electrical communication buses, resulting in reduced timing margins in other such situations.

Accordingly, what is needed is an arrangement which couples a memory device and its memory controller during memory driver training to reduce mismatches by adjusting the reference voltage of the memory device to improve the timing margins.

SUMMARY OF THE INVENTION

The present invention provides for a memory device and a memory controller, typically a DRAM memory device and more particularly, a GDDR3 memory device to be coupled during driver training to reduce mismatches by adjusting the reference voltage of the memory device to yield improvements in timing margins.

According to an aspect of the invention, a method of setting a memory device reference voltage based on a memory controller drive strength and the memory device termination value is provided in an electrical communication bus, typically a data net. The memory device is coupled in the electrical communication bus, with a corresponding memory controller during training of the termination impedance of the memory device. A "0" bit level voltage Vlow is initialized on the communication bus with the driver of the memory controller. The 0 bit level voltage is monitored at a first test path of the memory controller and adjusted until a change in the test path voltage is detected. The detected voltage is applied as the new Vlow voltage at a reference pair of resistors at the memory device to set the Vref voltage at the memory device. Optionally, the reference resistor arrangement is a pair of resistors. In an exemplary aspect, the Vref voltage is set halfway between a VDD voltage and the Vlow voltage.

Another aspect provides for both a high ("Vhigh") and low ("Vlow") voltage level to be set at the memory device reference resistor arrangement by the memory controller. The method includes setting both the high reference voltage and the low reference voltage of the memory device, respectively, to match the Vref at the memory device based on the resulting memory device termination. Embodiments of the invention include the memory device as a GDDR3 DRAM. A memory controller provides a GDDR3 interface through a data connection.

Another aspect of the invention includes a coupled memory controller and memory device in an electrical communication bus. A connection is provided between a memory interface of the memory controller to the memory device. The memory controller is programmed to write a voltage level on the connection. A reference resistor arrangement at the memory device is connected to a test path of the memory controller. The resistor arrangement in an exemplary embodiment is a pair of matched resistors. The test path is also connected to a D/A voltage of the memory controller. The memory controller is programmed for monitoring the test path voltage while changing the D/A voltage for setting the reference voltage at the memory device when the test path voltage switches from one level to another level.

Embodiments include the test path being a first test path with a first D/A voltage setting module for setting a low reference voltage, and further including a second test path with a second D/A voltage setting module connected thereto for setting a high reference voltage. The Vlow voltage on the connection is set as a 0 bit level and the Vhigh voltage is set as a "1" level. The reference voltage at the memory device is set as being halfway between the Vhigh and Vlow voltage levels.

These and other advantages and features that characterize the invention are set forth in the claims annexed hereto and forming a further part hereof. However, for a better understanding of the invention and of the advantages and objectives obtained through its use, reference should be made to the drawings, and to the accompanying descriptive matter, in which there are described exemplary embodiments of the invention.

DETAILED DESCRIPTION OF THE INVENTION

In one aspect, embodiments consistent with the invention may capitalize on the ability to couple a memory device such as a DRAM in a memory controller during driver training to reduce mismatches by adjusting the reference voltage in the memory device to yield improvements in timing margins. In more general terms, coupling the components on a shared electrical bus through level adjustment dramatically removes known offset issues. Further, while embodiments of the invention are described specifically for a GDDR3 interface from a memory controller to a GDDR3 memory device, the system and method described may be applied to any number of system and sub-system electrical communication buses. Ideally, this may apply where termination already exists. This feature provides advances over the prior art illustrated in FIG. 1 by reducing the resulting signal errors. Optionally, the speed at which the interface operates may be improved as a result of employing the system and method described.

Figure 1:
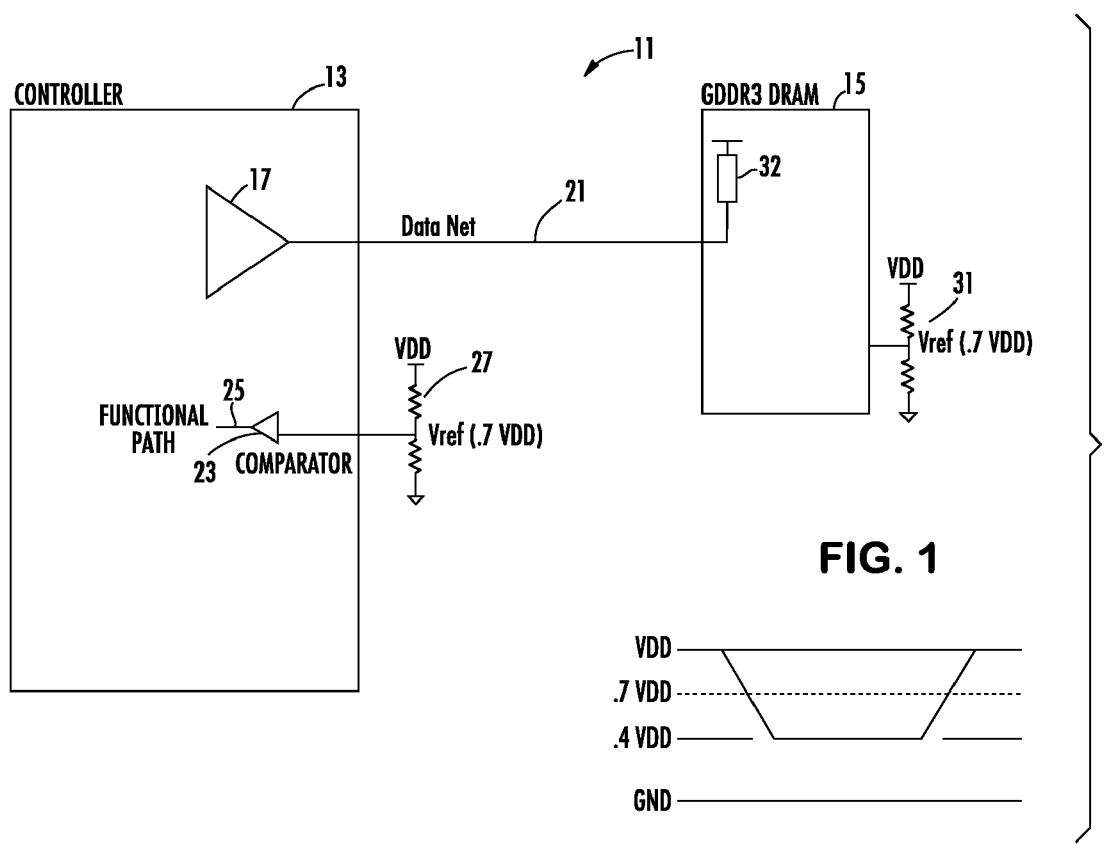
FIG. 1 is a schematic diagram illustrating a typical prior art interface in an electrical communication bus between a memory controller and a memory device, such as GDDR3 SDRAM.

Turning more particularly to the drawings, FIG. 1 shows a typical GDDR3 interface. In the system 11, a memory controller 13 is connected through a communication bus 21, i.e., data net, to a memory device 15, that may be a GDDR3 DRAM. The memory device 15 includes a termination device 32. A reference voltage is applied through a resistor arrangement 31. The memory controller 13 also includes a controller driver 17 which connects to a comparator 23 and a functional path 25. A resistor arrangement 27 provides a reference voltage for the memory controller 13.

Figure 2:
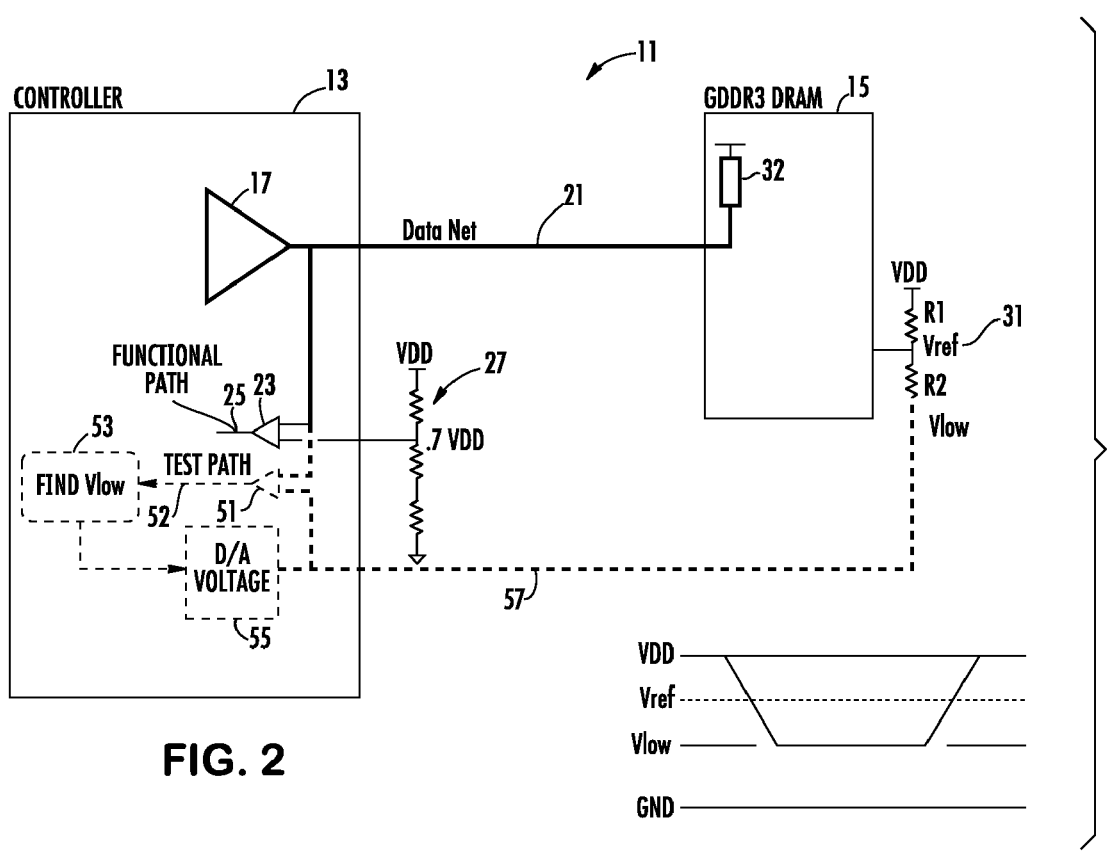
FIG. 2 is a schematic diagram of one embodiment of the invention for coupling a memory device and a memory controller during driver training to reduce mismatches.

In one embodiment, the invention may be generally shown by the modified system 11 illustrated in FIG. 2. When the memory controller driver 17 drives or initiates a voltage on the data net 21, the value of the voltage is based on the controller driver 17 strength and the memory device 15 termination 32. This determines what a 0 bit level voltage will be on the data net 21. In order to obtain the best timing margin, it is important to address any variations in impedances. Thus, in accordance with aspects of the invention, the reference voltage at the memory device 15 may be modified. More particularly, the controller 13 includes a comparator 51 with a test path 52 connected to a detector 53 which may be connected to a D/A voltage setting device 55. The test path and voltage setting device 55 are connected 57 to a reference pair of balanced resistors 31 of the memory device 15. In FIG. 1, resistor pairs 27 and 31 are the same. Each has two resistors of different values in order to generate the predetermined reference voltage of 0.7 VDD for both the memory controller and GDDR3 memory device. However, in FIG. 2 the pairs are different for the GDD3 case. The two resistors of pair 27 are different to generate a predetermined voltage of 0.7 VDD. The two resistors of pair 31 are the same in order to set a reference voltage at the midpoint of the Vlow voltage and the VDD voltage. The voltage on the test path is monitored 53 until it just changes at which point the D/A voltage device 55 sets the voltage at the second resistor R2 of resistor pair 31 at the memory device 15 to set a Vlow voltage as the 0 bit level voltage. The reference voltage at the memory device is thus set at exactly the midpoint between the Vlow voltage and a conventionally applied VDD voltage.

Figure 4:
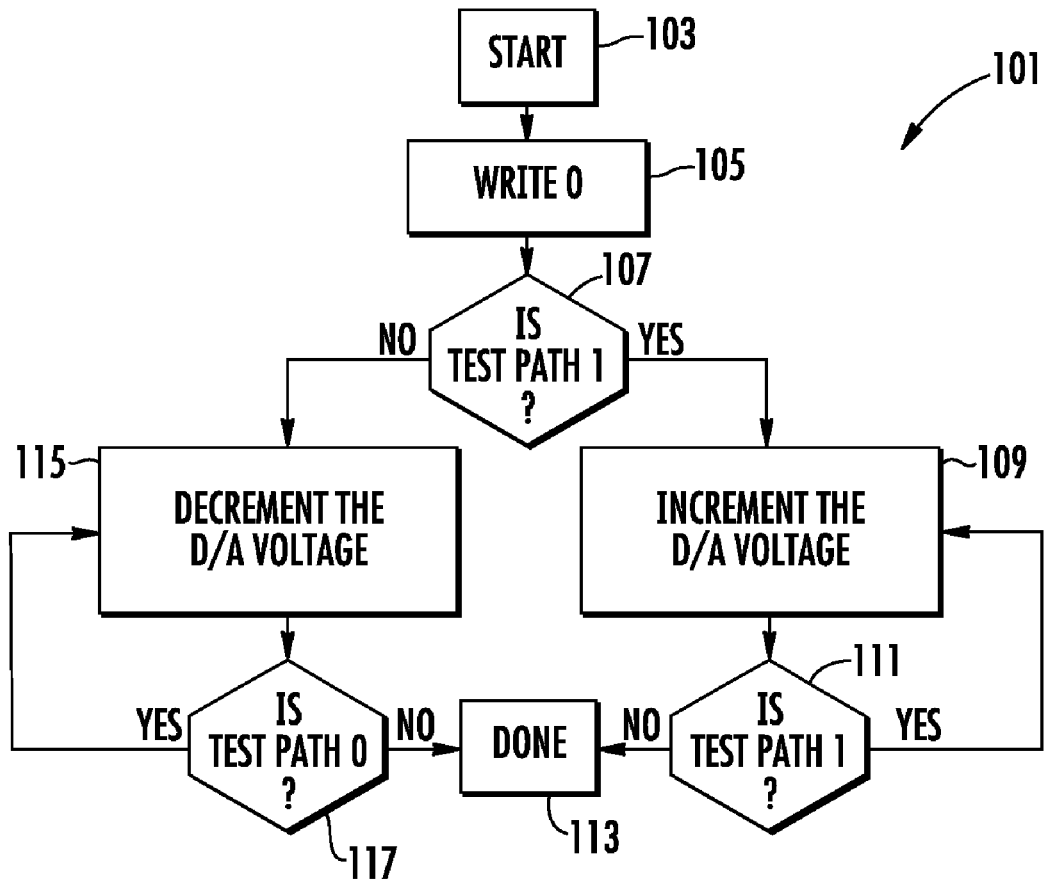
FIG. 4 is a flow diagram illustrating the operation during matching of the memory controller and memory device of FIG. 2.

The operation of the embodiment of FIG. 2 is better illustrated in flow chart 101 of FIG. 4. More specifically, training may be initiated at step 103 at which time the driver 17 writes at step 105 a 0 bit level voltage onto the net 21. The controller 13 checks at step 107 the test path to determine if the voltage on the test path is at a 1 bit level. If so, the Vlow may be too low and the D/A voltage is incremented at step 109. The test path may be checked at step 111 to determine if it is still at a 1 bit level, and if so, the D/A voltage continues to be incremented until the test path is no longer at a 1 bit level, at which point the process terminates at step 113 and the Vlow may be set at one of the resistors of the resistor pair 31 of the memory device 15.

On the left side of the flow chart, if the test path is not at a 1 bit level, then the Vlow may be too high and the D/A voltage may be decremented at step 115. The test path is again checked at step 117 and the voltage continually decremented at step 115 until the test path is no longer at a 0 bit level. As in the case with the right side of the flow chart, the process terminates at step 113 and the Vlow may be set at the resistor arrangement 31 of the memory device 15.

Figure 3:
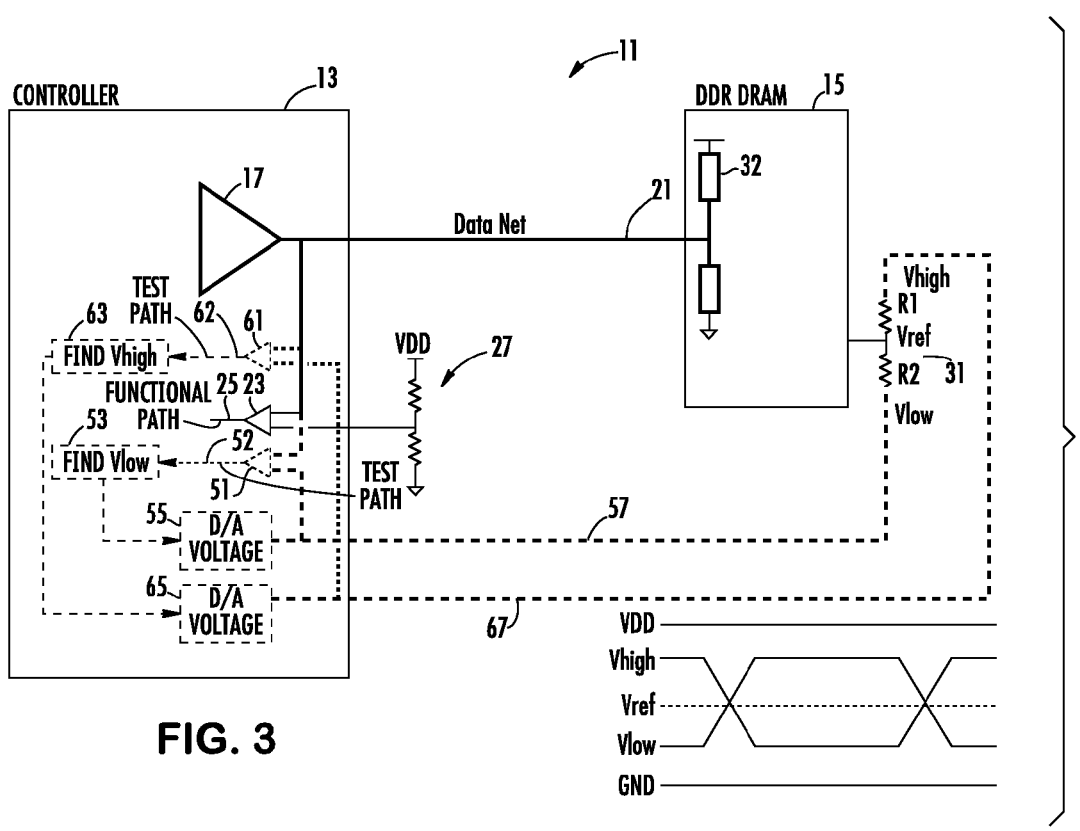
FIG. 3 is a second embodiment illustrating a connection between a memory device and a memory controller for coupling the memory device and memory controller during driver training to reduce mismatches.

In an alterative embodiment of the invention depicted in FIG. 3, both a Vhigh and a Vlow are set, and are not at power supply or ground levels. Training requires that two unique pins go to each memory device on the interface. As in the previous case, values are incremented or decremented via D/A voltage setting devices 55 and 65 until the levels just change, and then those values are set at the memory device reference voltage resistor arrangement to set the appropriate midpoint Vref with a balanced resistor pair 31, which includes resistors 59 and 69.

More specifically, in this embodiment of the system 11 shown in FIG. 3, the driver 17 drives a voltage on the data net 21 which is based in part on a second termination device 33, i.e., the pull down part of the termination. Initially, the driver 17 initiates a 0 bit level voltage ("Vlow") on the net 21, and the process and device operate as previously described with respect to the 0 bit level voltage with reference to FIG. 2 as to termination device 32.

After setting the Vlow voltage, driver 17 then writes a 1 bit level voltage on the net 21 as a Vhigh voltage. This voltage is applied to a Vhigh test path (not numbered) which includes comparator 61, detector 63 and D/A voltage setting device 65. When the voltage on the Vhigh test path just changes, then the D/A voltage setting device 65 sets the Vhigh voltage through connections 67 at a second resistor 69 of the resistor pair 31.

Figure 5:
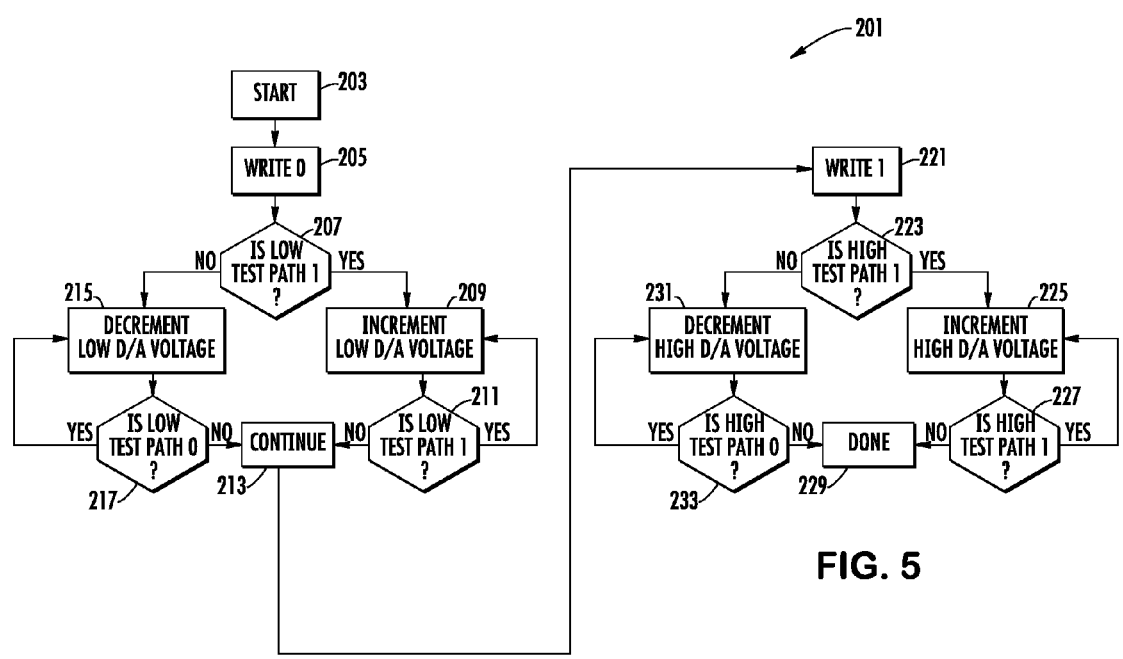
FIG. 5 is a flow diagram illustrating the operation during matching of the memory controller and memory device of FIG. 3.

The operation of the device of FIG. 3 is better illustrated by the flow chart 201 of FIG. 5. As in the case with the device of FIG. 2 and flow chart of FIG. 4, training initiates at step 203 with a controller driver writing at step 205 a 0 bit level voltage ("Vlow") on the data net. The Vlow test path may be tested at step 207 to determine if it is at a 1 bit level voltage. If so, then the Vlow may be too low and the D/A voltage may be incremented at step 209. The test path is again tested at step 211 and if the Vlow is still too low, the low D/A voltage is again incremented at step 209 until the test path is no longer at a 1 bit level, at which point the process terminates at step 213 with respect to the Vlow levels. On the left side, if the test path is not at a 1 bit level then the Vlow is too high and the low D/A voltage may be decremented at step 215. The test path is again checked at step 217 and the low D/A voltage decremented again until the test path is no longer at a 0 bit level. Thereafter, the controller driver writes a 1 bit level voltage ("Vhigh") on the data net at step 221. The high voltage test path may be tested at step 223 to determine if it is at a 1 bit level. If yes, the Vhigh is too low and the high D/A voltage may be incremented at step 225. The test path is again tested at step 227 and the voltage continually incremented at step 225 until the test path is no longer at a 1 bit level. Once the test path is not at a 1 bit level, the process terminates at step 229. The Vhigh may be set at the second of the resistor pair at the memory device, unless the process moved to the left side of the flow chart for Vhigh.

On the left hand side of the flow chart, if the test path is not at a 1 bit level, then the high D/A voltage may be decremented at step 231 and again tested at step 233. Decrementing of the high D/A continues until a high test path is no longer at a 0 bit level at which time the process terminates at step 229 and the Vhigh level for the second resistor of the resistor pair at the memory device is set.

Other application variables may play a role in the optimal training of the interface relative to the appropriate high, low and Vref levels. Driver impedance or termination values may vary with temperature and/or voltage level variations associated with activity on other system or sub-system resources. The calibration in accordance with the invention may be either repeated as conditions change for maintenance of optimal settings and performance, or unique settings may be saved for different conditions if desired. In one exemplary embodiment, a temperature change of greater than 20 degrees Celsius from the original or last calibration may trigger initiation of a new calibration, or may trigger the loading of an alternate set of previously stored calibration values associated with the new temperature.

While the invention is shown for a GDDR3 device and memory controller system, it will be apparent to those of ordinary skill that the methods herein may be applied to other industry standard or proprietary interfaces without deviating from the general methods disclosed. Thus, the invention in its broader aspects is therefore not limited to the specific details, representative apparatus and method, as shown and described. Accordingly, departures may be made from such details without departing from the spirit or scope of Applicants' general inventive concept.

What is claimed is:

1. A method of setting a memory device's reference voltage based on a memory controller's drive strength and the memory device's termination value, comprising:
   connecting a memory device in an electrical communication bus with a corresponding memory controller during memory device termination training;
   initializing a 0 bit level voltage on the communication bus with a driver of the memory controller;
   monitoring the 0 bit level voltage at a first test path of the memory controller, and adjusting the voltage at the first test path until a change in the test path voltage is detected as a Vlow voltage; and
   applying the Vlow voltage at a reference pair of balanced resistors at the memory device to set the Vref voltage at the memory device.

2. The method of claim 1, wherein said Vref voltage is set halfway between a VDD voltage and Vlow voltage applied to the pair of balanced resistors.

3. The method of claim 1, wherein said memory device is a GDDR3 DRAM.

4. The method of claim 1, wherein the reference pair of balanced resistors comprises a pair of identical resistors connecting a VDD voltage to the memory device, with a voltage divided Vref for the memory device set halfway between the VDD voltage applied to one of the pair of resistors and the Vlow voltage applied to another of the pair of reference resistors.

5. The method of claim 1, further comprising:
   initializing a 1 bit level voltage on the communication bus with the device of the memory controller;
   monitoring the 1 bit level voltage at a second test path of the memory controller;
   adjusting the voltage at the second test path until a change in the test path is detected as a new Vhigh voltage; and
   applying the new Vhigh voltage at a reference pair of resistors at the memory device to set the Vref voltage at the memory device.

6. The method of claim 5, wherein said Vref voltage is set halfway between the Vhigh voltage and Vlow voltage.

7. The method of claim 5, wherein the reference pair of resistors comprises a pair of resistors connected to the memory device with a voltage divided Vref set by the Vhigh voltage applied to one of the pair of resistors and the Vlow voltage applied to the other of the pair of the resistors.

8. A coupled memory controller and memory device in an electrical communication bus, comprising:
   a connection between a memory interface of the memory controller to the memory device, and the memory controller programmed to write a 0 bit level voltage level on the connection;
   a reference resistor arrangement connected to the memory device and to a test path of the memory controller, said test path being connected to a D/A voltage setting device of the memory controller; and
   said memory controller being programmed for monitoring the test path voltage while changing the D/A voltage for setting the reference voltage when the test path switches from one voltage level to another voltage level.

9. The device of claim 8, wherein said memory controller is configured for setting the reference voltage by setting a Vlow voltage at the reference resistor arrangement.

10. The device of claim 8, wherein said test path is a first test path with a first D/A voltage setting device for applying a Vlow voltage to the reference resistor arrangement, and further comprising a second test path for applying a Vhigh voltage to the reference resistor arrangement.

11. The device of claim 10, wherein the memory controller is programmed to write said voltage level on the connection as a first low 0 bit level voltage and as a second high 1 bit level voltage.

12. The device of claim 11, wherein said reference resistor arrangement is a pair of reference resistors, and wherein said memory controller is connected for applying said first low 0 bit level voltage to one of the pair of reference resistors, and for applying said second high 1 bit level voltage to another of the pair of reference resistors for setting the reference voltage between said low voltage and high voltage.

13. The device of claim 11, wherein said memory device is a GDDR3 DRAM.

14. The device of claim 8, further comprising a detector on said test path for detecting a voltage level thereon.

15. A coupled memory controller and memory device in an electrical communication bus, comprising:
   a connection between a memory interface of the memory controller to the memory device, and the memory controller programmed to write a first voltage level and a second voltage level on the connection;
   a reference resistor arrangement connected to the memory device and to a first test path of the memory controller, said first test path being connected to a first D/A voltage setting device of the memory controller, the reference resistor arrangement further connected to a second test path of the memory controller, and said second test path being connected to a second D/A voltage setting device of the memory controller; and said memory controller being programmed for monitoring the first test path voltage for setting a Vlow voltage at the reference resistor arrangement, and for monitoring the second test path voltage for setting a Vhigh voltage at the reference resistor arrangement, for setting the reference voltage at halfway between the Vhigh and the Vlow voltage.

16. The device of claim 15, wherein said reference resistor arrangement comprises a pair of resistors, and said memory controller is connected for setting the Vlow voltage at one of the pair of resistors, and for setting the Vhigh voltage at another of the pair of resistors.

17. The device of claim 15, wherein said memory device comprises a driver connected to a termination device for affecting the voltage set on the connection by the memory controller.

18. The device of claim 15, wherein said memory controller comprises a driver for writing said first voltage level and second voltage level on said connection.

19. The device of claim 15, further comprising a first detector on said first test path for detecting a low voltage level thereon, and a second detector on said second test path for detecting a high voltage level thereon.

20. The device of claim 15, wherein said memory device comprises a GDDR3 DRAM.

* * * * *